(12) United States Patent
Carrillo et al.

(10) Patent No.: US 7,671,167 B2
(45) Date of Patent: *Mar. 2, 2010

(54) POLY(ARYLENE ETHER) COPOLYMER

(75) Inventors: Alvaro Carrillo, Delmar, NY (US);
Erik René Delsman, Breda (NL); Hua Guo, Selkirk, NY (US); Alexey Kruglov, Glenmont, NY (US); Edward N. Peters, Lenox, MA (US)

(73) Assignee: Sabic Innovative Plastics IP B.V. (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/414,856

(22) Filed: Mar. 31, 2009

(65) Prior Publication Data

US 2009/0247724 A1 Oct. 1, 2009

Related U.S. Application Data

(63) Continuation of application No. 11/298,182, filed on Dec. 8, 2005, now Pat. No. 7,541,421.

(51) Int. Cl.
*C08G 65/38* (2006.01)
(52) U.S. Cl. .................................... 528/219
(58) Field of Classification Search .............. 528/86, 528/218, 219
See application file for complete search history.

(56) References Cited

U.S. PATENT DOCUMENTS

| | | |
|---|---|---|
| 3,306,874 A | 2/1967 | Hay |
| 3,306,875 A | 2/1967 | Hay |
| 3,496,236 A | 2/1970 | Cooper et al. |
| 3,838,102 A | 9/1974 | Bennett et al. |
| 3,987,109 A | 10/1976 | Brennan et al. |
| 4,116,939 A | 9/1978 | Cooper et al. |
| 4,289,682 A | 9/1981 | Peters |
| 4,463,164 A | 7/1984 | Dalton et al. |
| 4,521,584 A | 6/1985 | Heitz et al. |
| 4,532,306 A | 7/1985 | Sugio et al. |
| 4,677,185 A | 6/1987 | Heitz et al. |
| 4,701,514 A | 10/1987 | Percec |
| 4,704,430 A | 11/1987 | Freitag et al. |

(Continued)

FOREIGN PATENT DOCUMENTS

WO   WO0046273 A1   8/2000

(Continued)

OTHER PUBLICATIONS

JP49069798A; Abstract Only; 2 pages.

(Continued)

*Primary Examiner*—Mark Eashoo
*Assistant Examiner*—Liam J Heincer
(74) *Attorney, Agent, or Firm*—Cantor Colburn LLP

(57) ABSTRACT

A poly(arylene ether) copolymer is the product of oxidative copolymerization of monomers including a monohydric phenol and a dihydric phenol. It has an intrinsic viscosity of about 0.04 to about 0.15 deciliter per gram and, on average, about 1.8 to about 2 hydroxyl groups per molecule. The poly(arylene ether) copolymer is enriched in low molecular weight copolymer chains and copolymer chains that include a terminal unit derived from the dihydric phenol.

17 Claims, 1 Drawing Sheet

U.S. PATENT DOCUMENTS

| | | | |
|---|---|---|---|
| 4,749,756 | A | 6/1988 | Percec |
| 4,923,932 | A | 5/1990 | Katayose et al. |
| 5,021,543 | A | 6/1991 | Mayska et al. |
| 5,218,030 | A | 6/1993 | Katayose et al. |
| 5,250,486 | A | 10/1993 | Shaffer et al. |
| 5,270,435 | A | 12/1993 | Pfaendner et al. |
| 5,498,689 | A | 3/1996 | Furuta et al. |
| 5,621,066 | A | 4/1997 | Edema |
| 5,703,143 | A | 12/1997 | Hiratani et al. |
| 6,211,327 | B1 | 4/2001 | Braat et al. |
| 6,384,176 | B1 | 5/2002 | Braat et al. |
| 6,407,200 | B1 | 6/2002 | Singh et al. |
| 6,417,274 | B1 | 7/2002 | Braat et al. |
| 6,437,084 | B1 | 8/2002 | Birsak et al. |
| 6,437,085 | B1 | 8/2002 | Braat et al. |
| 6,469,128 | B1 | 10/2002 | Guo et al. |
| 6,521,735 | B2 | 2/2003 | Mitsui et al. |
| 6,576,738 | B2 | 6/2003 | Braat et al. |
| 6,689,920 | B2 | 2/2004 | Ishii et al. |
| 6,794,481 | B2 | 9/2004 | Amagai et al. |
| 6,835,785 | B2 | 12/2004 | Ishii et al. |
| 6,835,786 | B2 | 12/2004 | Ishii et al. |
| 7,151,158 | B2 | 12/2006 | Ingelbrecht |
| 7,183,350 | B2 | 2/2007 | Balfour et al. |
| 7,205,377 | B2 | 4/2007 | Ingelbrecht et al. |
| 2002/0040126 | A1 | 4/2002 | Takeda et al. |
| 2002/0173597 | A1 | 11/2002 | Zarnoch et al. |
| 2003/0176543 | A1 | 9/2003 | Patel |
| 2003/0194562 | A1 | 10/2003 | Ishii et al. |
| 2003/0229256 | A1 | 12/2003 | Ishii et al. |
| 2004/0102583 | A1 | 5/2004 | Freshour et al. |
| 2004/0214004 | A1 | 10/2004 | Amagai et al. |
| 2005/0065241 | A1 | 3/2005 | Ishii et al. |
| 2005/0070685 | A1 | 3/2005 | Mitsui et al. |
| 2005/0090624 | A1 | 4/2005 | Norisue et al. |
| 2005/0130438 | A1 | 6/2005 | Rotondaro et al. |
| 2005/0171331 | A1 | 8/2005 | Ingelbrecht et al. |
| 2005/0186430 | A1 | 8/2005 | Amagai et al. |
| 2005/0192411 | A1 | 9/2005 | Brown et al. |
| 2006/0041086 | A1 | 2/2006 | Birsak et al. |
| 2006/0160982 | A1 | 7/2006 | Ishii et al. |
| 2006/0255498 | A1 | 11/2006 | Ota |
| 2007/0106051 | A1 | 5/2007 | Carrillo et al. |

FOREIGN PATENT DOCUMENTS

| | | |
|---|---|---|
| WO | WO0206376 A2 | 1/2002 |
| WO | WO2005003211 A1 | 1/2005 |
| WO | WO2005075540 A1 | 8/2005 |

OTHER PUBLICATIONS

International Search Report; International Application No. PCT/US2006/046637; International Filing Date: Jun. 12, 2006; Date of Mailing: May 25, 2007; 3 pages.

Written Opinion of the International Searching Authority; International Application No. PCT/US2006/046637; International Filing Date Jun. 12, 2006; Priority Date: Aug. 12, 2005; 4 pgs.

Dwain M. White, Reactions of Poly(phenylene Oxide)s with Quinones . . . 4'-Diphenoquinone, Journal of Polymer Science: Polymer Chem. Edition, vol. 19, 1367-1383 (1981).

Dwain M. White, Polymerization of Oxidative Coupling . . . (2,6-diphenyl-1, 4-phenylene Ether) with Phenois, Journal of Polymer Science, Part A-1, vol. 9, 663-675 (1971).

WO2006007966; Jan. 26, 2006; Abstract Only (1 page).
JP51057800A2; May 20, 1976; Abstract Only (1 page).
JPS60-229923; Nov. 15, 1985; Human Translation (6 pages).
EP215257A1; Mar. 25, 1987, Abstract Only (1 page).
JP02120357A2; May 8, 1990; Abstract Only (1 page).
JP02233759A2; Sep. 17, 1990; Abstract Only, (1 page).
CS272840B1; Feb. 12, 1991; Abstract Only; (1 page).
JP03045648A2; Feb. 27, 1991; Abstract Only; (2 page).
JP03045649A2; Feb. 27, 1991; Abstract Only; (2 page).
JP1998265552A; Oct. 6, 1998; Machine Translation (18 pages).
JP1998273518A; Oct. 13, 1998; Machine Translation (22 pages).
JP2000007763A; Jan. 11, 2000; Machine Translation (17 pages).
JP2003292610A; Oct. 15, 2003; Machine Translation (23 pages).
JP2004099824A; Apr. 2, 2004; Machine Translation (30 pages).
JP2004307554A, Nov. 4, 2004; Machine Translation (32 pages).
JP2004115619; Apr. 15, 2004; Machine Translation (18 pages).
JP2004256717A, Sep. 16, 2004; Machine Translation (41 pages).
JP2004331958A; Nov. 25, 2004; Machine Translation (8 pages).
JP2004313057A; Nov. 11, 2004; Machine Translation (19 pages).
JP2004104097A; Apr. 2, 2004; Machine Translation (15 pages).
JP2006008979A; Jan. 12, 2006; Machine Translation (16 pages).
JP2006002005A; Jan. 5, 2006; Machine Translation (33 pages).

Factor et al., The Unusual Solubility Behavior of Poly(2,6-Dimethyl-1, 4-Phenylene Ether) in Methylene Chloride Poly. Letters, vol. 7, No. 3 (1969) 205-209.

Challa et al., Oxidative Phenol Coupling Catalyzed by Polymer-Bound Copper-Imidazole Complexes, Makromol. Chem., Maromol, Symp., 59, (1992), 59-74.

Risse et al., Preparationand Characterization of Poly[ocy(2,6-dimethyl-1,4-phenylene)] with Functional End Groups, Makromol. Chem. 186 (1985), 1835-1853.

Percec et al., Synthesis of a, w-bis(2,6-dimethylphenol) . . . in the presence of 2,2-di(4-hydroxy-3,5-dimethyl)propane, Polymer Bulletin, vol. 24, No. 5 (1990), 493-500.

Nava et al., Functional Polymers and Sequential . . . poly(2,6-dimethyl-1, 4-phenylene oxide) Oligomers, J. Polym. Sci., Part A: Polymer Chemistry (1986), vol. 24, No. 4, 965-990.

POLY(ARYLENE ETHER) COPOLYMER

CROSS-REFERENCE TO RELATED APPLICATIONS

This application is a continuation of U.S. Nonprovisional patent application Ser. No. 11/298,182 filed Dec. 8, 2005 now U.S. Pat. No. 7,541,421, which is incorporated by reference herein in its entirety.

BACKGROUND OF THE INVENTION

Poly(arylene ether) resins and their blends with styrenic resins are used in many commercial applications that benefit from their temperature resistance, stiffness, impact strength, and dielectric properties. Conventional poly(arylene ether) resins have intrinsic viscosities of about 0.3 to about 0.6 deciliter per gram, as measured in chloroform at 25° C. Conventional poly(arylene ether) resins also have, on average, about one terminal hydroxy group per polymer chain. Recently, some new applications for poly(arylene ether) resins, including compositions for printed circuit board fabrication, have created a need for poly(arylene ether) resins with lower intrinsic viscosities and more than one terminal hydroxy group per polymer chain. However, known synthesis methods are not suitable for the preparation of such low intrinsic viscosity, high functionality poly(arylene ether) resins. For example, as described below, the present inventors found that a conventional method of using an aqueous solution of chelating agent to extract polymerization catalyst metal ion from an organic solution of poly(arylene ether) resin resulted in formation of dispersions that made it difficult to separate the poly(arylene ether) from the polymerization catalyst. There is therefore a need for new poly(arylene ether) synthesis methods that avoid the formation of a dispersion during purification of poly(arylene ether) resins having low intrinsic viscosity and high functionality. There is also a need for poly(arylene ether) resins that are enriched in low molecular weight poly(arylene ether) chains.

BRIEF DESCRIPTION OF THE INVENTION

The above-described and other drawbacks are alleviated by a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein the poly(arylene ether) copolymer comprises about 10 to about 70 mole percent of copolymer chains comprising a terminal unit derived from the dihydric phenol.

Another embodiment is a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein the poly(arylene ether) copolymer comprises about 10 to about 60 weight percent of copolymer chains comprising 1 to 15 aromatic ring moieties.

Another embodiment is a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein at least 10 weight percent of the poly(arylene ether) copolymer consists of copolymer chains comprising 1 to 15 aromatic ring moieties.

Another embodiment is a poly(arylene ether) copolymer prepared by a method, comprising: oxidatively copolymerizing a monohydric phenol and a dihydric phenol in an aromatic hydrocarbon solvent in the presence of a catalyst comprising a metal ion and a nitrogen-containing ligand to form a solution comprising a polyfunctional poly(arylene ether) having an intrinsic viscosity of about 0.04 to about 0.15 deciliter per gram at 25° C. in chloroform; and contacting the polyfunctional poly(arylene ether) solution with an aqueous solution of a chelating agent to extract the metal ion from the solution; wherein the chelating agent and metal ion are present in a molar ratio of about 1.0 to about 1.5.

Other embodiments are described in detail below.

DETAILED DESCRIPTION OF THE INVENTION

Figure 1:
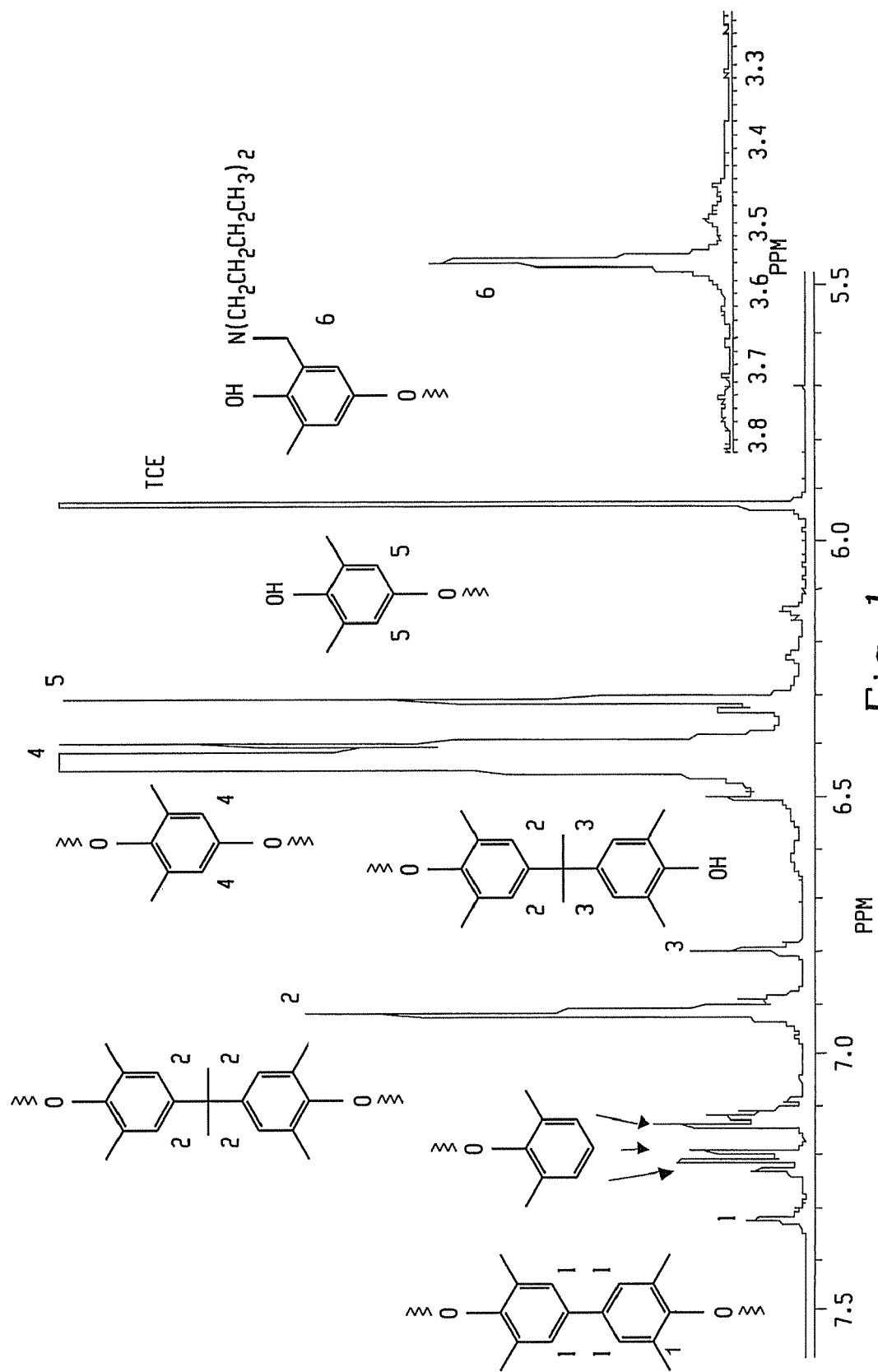
FIG. 1 is a partial $^1$H NMR spectrum of product copolymer.

One embodiment is a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein the poly(arylene ether) copolymer comprises about 10 to about 70 mole percent of copolymer chains comprising a terminal unit derived from the dihydric phenol. In the process of research on methods of preparing poly(arylene ether) resins having low intrinsic viscosity and high functionality, the present inventors found that it was possible to prepare copolymer resins that are enriched in low molecular weight poly(arylene ether) chains and exhibit a substantial fraction of poly(arylene ether) chains comprising a terminal unit derived from the dihydric phenol. These resins are particularly useful as components of curable compositions for electronic materials.

The poly(arylene ether) copolymer is the product of oxidative copolymerization of monomers comprising a monohydric phenol and a dihydric phenol. In one embodiment, the monohydric phenol has the structure

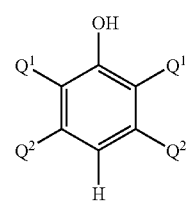

wherein each occurrence of $Q^1$ is independently halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, $C_6$-$C_{12}$ aryl, $C_1$-$C_{12}$ haloalkyl, $C_1$-$C_{12}$ hydrocarbonoxy, or $C_1$-$C_{12}$ halohydrocarbonoxy wherein at least two carbon atoms separate the halogen and oxygen atoms; and wherein each occurrence of $Q^2$ is independently hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, $C_6$-$C_{12}$ aryl, $C_1$-$C_{12}$ haloalkyl, $C_1$-$C_{12}$ hydrocarbonoxy, or $C_2$-$C_{12}$ halohydrocarbonoxy wherein at least two carbon atoms separate the halogen and oxygen atoms. In one embodiment, the monohydric phenol is selected from 2-methylphenol, 2,5-dimethylphenol, 2,6-dimethylphenol, 2,3,6-trimethylphenol, and combinations thereof. In one embodiment, the monohydric phenol comprises 2,6-dimethylphenol.

In addition to the monohydric phenol, the monomers comprise a dihydric phenol. In one embodiment, the dihydric phenol has the structure

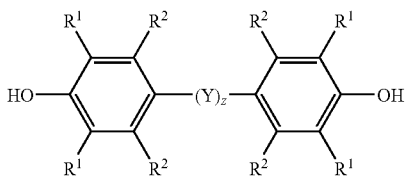

wherein each occurrence of $R^1$ and $R^2$ is independently hydrogen, halogen, primary or secondary $C_1$-$C_{12}$ alkyl, $C_1$-$C_{12}$ alkenyl, $C_1$-$C_{12}$ alkynyl, $C_1$-$C_{12}$ aminoalkyl, $C_1$-$C_{12}$ hydroxyalkyl, $C_6$-$C_{12}$ aryl (including phenyl), $C_1$-$C_{12}$ haloalkyl, $C_1$-$C_{12}$ hydrocarbonoxy, or $C_2$-$C_{12}$ halohydrocarbonoxy wherein at least two carbon atoms separate the halogen and oxygen atoms; Z is 0 or 1; and Y is selected from

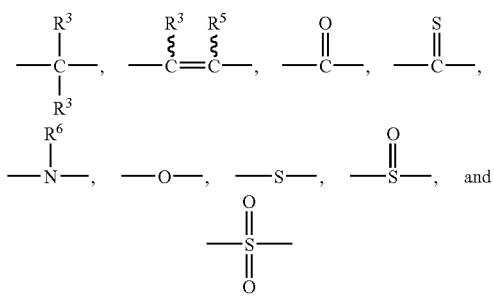

wherein each occurrence of $R^3$-$R^6$ is independently hydrogen or $C_1$-$C_{12}$ hydrocarbyl. As used herein, the term "hydrocarbyl", whether used by itself, or as a prefix, suffix, or fragment of another term, refers to a residue that contains only carbon and hydrogen. The residue may be aliphatic or aromatic, straight-chain, cyclic, bicyclic, branched, saturated, or unsaturated. It may also contain combinations of aliphatic, aromatic, straight chain, cyclic, bicyclic, branched, saturated, and unsaturated hydrocarbon moieties. In one embodiment, the dihydric phenol is selected from 1,1-bis(3,5-dimethyl-4-hydroxyphenyl)ethane, 1,1-bis(3-chloro-4-hydroxyphenyl)ethane, 1,1-bis(3-methyl-4-hydroxyphenyl)ethane, 1,2-bis(4-hydroxy-3,5-dimethylphenyl)-1,2-diphenylethane, 1,2-bis(3-methyl-4-hydroxyphenyl)-1,2-diphenylethane, 1,2-bis(3-methyl-4-hydroxyphenyl)ethane, 2,2'-binaphthol, 2,2'-biphenol, 2,2'-dihydroxy-4,4'-dimethoxybenzophenone, 2,2'-dihydroxy-4-methoxybenzophenone, 2,2'-dihydroxybenzophenone, 2,2-bis(3,5-dichloro-4-hydroxyphenyl)propane, 2,2-bis(3-bromo-4-hydroxyphenyl)propane, 2,2-bis(3-phenyl-4-hydroxyphenyl)propane, 2,2-bis(3-methyl-4-hydroxyphenyl)propane, 2,2-bis(3,5-dimethyl-4-hydroxyphenyl)propane, 1,1-bis(3,5-dimethyl-4-hydroxyphenyl)-1-phenylethane, 1,1-bis(3-chloro-4-hydroxyphenyl)-1-phenylethane, 1,1-bis(3-methyl-4-hydroxyphenyl)-1-phenylethane, 2,2-bis(4-hydroxy-3,5-dimethyl phenyl)-1-phenylpropane, 2,2-bis(4-hydroxy-3,5-dimethyl phenyl)hexane, 2,2-bis(4-hydroxy-3,5-dimethylphenyl)pentane, 2,2-bis(3-methyl-4-hydroxynaphthyl)propane, 2,2-bis(3-methyl-4-hydroxyphenyl)-1-phenylpropane, 2,2-bis(3-methyl-4-hydroxyphenyl)hexane, 2,2-bis(3-methyl-4-hydroxyphenyl)pentane, 2,2'-methylenebis(4-methylphenol), 2,2'-methylenebis[4-methyl-6-(1-methylcyclohexyl)phenol], 3,3',5,5'-tetramethyl-4,4'-biphenol, 3,3'-dimethyl-4,4'-biphenol, bis(2-hydroxyphenyl)methane, bis(4-hydroxy-2,6-dimethyl-3-methoxyphenyl)methane, bis(3,5-dimethyl-4-hydroxyphenyl)methane, bis(3-methyl-4-hydroxyphenyl)methane, bis-(4-hydroxy-3,5-dimethyl phenyl)-cyclohexylmethane, bis(4-hydroxy-3,5-dimethyl phenyl)phenylmethane, bis(3-methyl-4-hydroxyphenyl)cyclohexylmethane, bis(3-methyl-4-hydroxyphenyl)methane, bis(3,5-dimethyl-4-hydroxyphenyl)methane, bis(3-methyl-4-hydroxyphenyl)phenylmethane, 2,2',3,3',5,5'-hexamethyl-4,4'-biphenol, octafluoro-4,4'-biphenol, 2,3,3,5,5'-pentamethyl-4,4'-biphenol, 1,1-bis(3,5-dibromo-4-hydroxyphenyl)cyclohexane 1,1-bis(3,5-dimethyl-4-hydroxyphenyl)cyclohexane, bis(3-methyl-4-hydroxyphenyl)cyclohexane, tetrabromobiphenol, tetrabromobisphenol A, tetrabromobisphenol S, 2,2'-diallyl-4,4'-bisphenol A, 2,2'-diallyl-4,4'-bisphenol S, 3,3',5,5'-tetramethyl-4,4'-bisphenol sulfide, 3,3'-dimethyl bisphenol sulfide, 3,3',5,5'-tetramethyl-4,4'-bisphenol sulfone, and combinations thereof. In one embodiment, the dihydric phenol comprises 2,2-bis(3,5-dimethyl-4-hydroxyphenyl)propane.

The monohydric phenol and the dihydric phenol may be used in any ratio consistent with achieving the intrinsic viscosity of about 0.04 to about 0.15 deciliter per gram, measured at 25° C. in chloroform. In one embodiment, the monomers comprise the monohydric phenol and the dihydric phenol in a mole ratio of about 3 to about 110. Within this range, the ratio may be at least about 5, or at least about 7. Also within this range, the ratio may be up to about 50, or up to about 25. Using such a ratio helps ensure that the target intrinsic viscosity is achieved.

As noted above, the poly(arylene ether) copolymer may have an intrinsic viscosity of about 0.04 to about 0.15 deciliter per gram, measured at 25° C. in chloroform. Within this range, the intrinsic viscosity may be at least about 0.06 deciliter per gram. Also within this range, the poly(arylene ether) may have an intrinsic viscosity up to about 0.12 deciliter per gram, or up to about 0.09 deciliter per gram.

The poly(arylene ether) comprises, on average, about 1.8 to about 2 hydroxyl groups per molecule. Within this range, it may comprise at least 1.85 hydroxyl groups per molecule. Also within this range, it may comprise up to about 1.95 hydroxyl groups per molecule.

The poly(arylene ether) copolymer comprises about 10 to about 70 mole percent of copolymer chains comprising a terminal unit derived from the dihydric phenol. For example, when the dihydric phenol is 2,2-bis(3,5-dimethyl-4-hydroxyphenyl)propane, the poly(arylene ether) copolymer comprises about 10 to about 70 mole percent of copolymer chains comprising a terminal unit having the structure

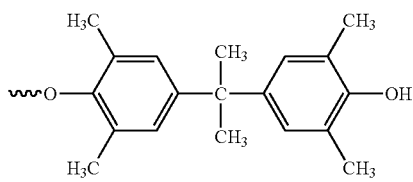

wherein the wavy line at the left end of the structure represents a single bond to the remainder of the copolymer chain. Within the above range, the mole percent of copolymer chains comprising a terminal unit derived from the dihydric phenol may be at least about 20, or at least about 30, or at least about 40. Also within this range, the mole percent of copolymer chains comprising a terminal unit derived from the dihydric phenol may be up to about 60. The mole percent of copolymer chains comprising a terminal unit derived from the dihydric phenol varies with the intrinsic viscosity of the poly(arylene ether). Thus, in one embodiment, the poly(arylene ether) copolymer has an intrinsic viscosity of about 0.04 to about 0.06 deciliter per gram, and the poly(arylene ether) copolymer comprises about 50 to about 70 mole percent of copolymer chains comprising a terminal unit derived from the dihydric phenol. In one embodiment, the poly(arylene ether) copolymer has an intrinsic viscosity of about 0.06 to about 0.09 deciliter per gram; and wherein the poly(arylene ether) copolymer comprises about 35 to about 55 mole percent of copolymer chains comprising a terminal unit derived from the dihydric phenol. In one embodiment, the poly(arylene ether) copolymer has an intrinsic viscosity of about 0.09 to about 0.15 deciliter per gram; and wherein the poly(arylene ether) copolymer comprises about 10 to about 45 mole percent of copolymer chains comprising a terminal unit derived from the dihydric phenol.

In one embodiment, the poly(arylene ether) copolymer has a weight average molecular weight of about 1,000 to about 6,000 atomic mass units as determined by gel permeation chromatography as described in the working examples. Within this range, the weight average molecular weight may be at least about 1,500 atomic mass units, or at least about 2,000 atomic mass units. Also within this range, the weight average molecular weight may be up to about 5,000 atomic mass units, or up to about 4,000 atomic mass units, or up to about 3,000 atomic mass units. In one embodiment, the poly(arylene ether) copolymer has a number average molecular weight of about 500 to about 2,500 atomic mass units as determined by gel permeation chromatography as described in the working examples. Within this range, the number average molecular weight may be at least about 700 atomic mass units, or at least about 1,000 atomic mass units. Number average molecular weight and weight average molecular weight may be measured by gel permeation chromatography as described in the working examples. Also within this range, the number average molecular weight may be up to about 2,000 atomic mass units, or up to about 1,500 atomic mass units. In one embodiment, the poly(arylene ether) copolymer has a ratio of weight average molecular weight to number average molecular weight of about 2 to about 3. Within this range, the ratio may be at least about 2.1. Also within this range, the ratio may be up to about 2.8, or up to about 2.6.

Although the poly(arylene ether) copolymer is enriched in low molecular weight species, it may comprise very low levels of residual monomers. Thus, in one embodiment where the poly(arylene ether) copolymer comprises 2,6-dimethylphenol and the dihydric phenol comprises 2,2-bis(3,5-dimethyl-4-hydroxyphenyl)propane, the poly(arylene ether) copolymer comprises only about 150 to about 1350 parts per million by weight of residual (unreacted) 2,6-dimethylphenol and/or only about 0.2 to about 2.7 weight percent of residual (unreacted) 2,2-bis(3,5-dimethyl-4-hydroxyphenyl)propane, each as measured by gas chromatography as described in the working examples.

The monohydric phenol is incorporated into the poly(arylene ether) copolymer primarily as a 1,4-phenylene ether unit. However, under certain polymerization conditions, some of the monohydric phenol may form a diphenoquinone species that is incorporated into the poly(arylene ether) copolymer. For example, when the monohydric phenol comprises 2,6-dimethylphenol and the dihydric phenol comprises 2,2-bis(3,5-dimethyl-4-hydroxyphenyl)propane, the poly(arylene ether) may comprise about 0.5 to about 1.5 weight percent of units derived from 3,3',5,5'-tetramethyl-4,4'-biphenol. When the copolymerization is conducted in the presence of a primary or secondary amine catalyst component, the poly(arylene ether) may incorporate amine substituents. For example, when oxidative copolymerization comprises polymerizing in the presence of a catalyst comprising di-n-butylamine, the poly(arylene ether) may comprise about 0.2 to about 2 weight percent of incorporated dibutylamine groups (measured as —N(CH$_2$CH$_2$CH$_2$CH$_3$)$_2$ and determined by $^1$H NMR as described in the working examples.

One embodiment is a poly(arylene ether) copolymer, wherein the poly(arylene ether) copolymer is the product of oxidative copolymerization of monomers consisting 2,6-dimethylphenol and 2,2-bis(3,5-dimethyl-4-hydroxyphenyl)propane in a weight ratio of about 3 to about 9; wherein the poly(arylene ether) copolymer has an intrinsic viscosity of about 0.04 to about 0.09 deciliter per gram, measured at 25° C. in chloroform; wherein the poly(arylene ether) comprises, on average, about 1.85 to about 1.95 hydroxyl groups per molecule; and wherein the poly(arylene ether) copolymer comprises about 35 to about 70 mole percent of copolymer chains comprising a terminal unit derived from the dihydric phenol.

One way to characterize the degree of low molecular weight species in the poly(arylene ether) copolymer is to quantify the weight fraction of the poly(arylene ether) copolymer that is made up of molecules having 1 to 15 aromatic ring moieties. For example, a unit derived from a monohydric phenol would contribute one aromatic ring moiety, a unit derived from a dihydric phenol would contribute two aromatic ring moieties, and a unit derived from a diphenoquinone would contribute two aromatic ring moieties. The quantification can be accomplished using gradient elusion HPLC in conjunction with mass spectrometry, as described in the working examples. Thus, one embodiment is a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein the poly(arylene ether) copolymer comprises about 10 to about 75 weight percent of copolymer chains comprising 1 to 15 units aromatic ring moieties. Within the intrinsic viscosity range of 0.04 to 0.15 deciliter per gram, the intrinsic viscosity may be at least about 0.06. Also within the intrinsic viscosity range of 0.04 to 0.15 deciliter per gram, the intrinsic viscosity may be up to about 0.12 deciliter per gram, or up to about 0.09 deciliter per gram. Within the range of about 1.8 to about 2 hydroxyl groups per molecule, the number of hydroxyl groups per molecule may be at least about 1.85, or up to about 1.95. Within the range of about 10 to about 75 weight percent of copolymer chains comprising 1 to 15 aromatic ring moieties, the weight percent of copolymer chains comprising 1 to 15 aromatic ring moieties may be at least about 30 weight percent, at least about 50 weight percent, or up to about 60 weight percent, or up to about 40 weight percent. In one embodiment, the poly(arylene ether) copolymer has an intrinsic viscosity of about 0.04 to about 0.06 deciliter per gram and comprises about 50 to about 75 weight percent of copolymer chains comprising 1 to 15 aromatic ring moieties. In one embodiment, the poly(arylene ether) copolymer has an intrinsic viscosity of about 0.06 to about 0.09 deciliter per gram and comprises about 30 to about 60 weight percent of copolymer chains comprising 1 to 15 aromatic ring moieties. In one embodiment, the poly(arylene ether) copolymer has an intrinsic viscosity of about 0.09 to about 0.15 deciliter per gram and comprises about 10 to about 40 weight percent of copolymer chains comprising 1 to 15 aromatic ring moieties.

One embodiment is a poly(arylene ether) copolymer, wherein the poly(arylene ether) copolymer is the product of oxidative copolymerization of monomers consisting 2,6-dimethylphenol and 2,2-bis(3,5-dimethyl-4-hydroxyphenyl) propane in a weight ratio of about 3 to about 9; wherein the poly(arylene ether) copolymer has an intrinsic viscosity of about 0.04 to about 0.09 deciliter per gram, measured at 25° C. in chloroform; wherein the poly(arylene ether) comprises, on average, about 1.85 to about 1.95 hydroxyl groups per molecule; and wherein the poly(arylene ether) copolymer comprises about 30 to about 60 weight percent of copolymer chains comprising 1 to 15 aromatic ring moieties.

Another way to characterize the degree of low molecular weight species in the poly(arylene ether) copolymer is to determine the monomeric composition of the 10 weight percent of the sample having the lowest molecular weight species. For example, at least 10 weight percent of a poly(arylene ether) copolymer may consist of copolymer chains comprising 1 to 15 aromatic ring moieties. This characterization may be performed using the same chromatography-mass spectrometry data mentioned above. Thus, one embodiment is a poly(arylene ether) copolymer, wherein the poly(arylene ether) copolymer is the product of oxidative copolymerization of monomers comprising a monohydric phenol and a dihydric phenol; wherein the poly(arylene ether) copolymer has an intrinsic viscosity of about 0.04 to about 0.15 deciliter per gram, measured at 25° C. in chloroform; wherein the poly(arylene ether) comprises, on average, about 1.8 to about 2 hydroxyl groups per molecule; and wherein at least 10 weight percent of the poly(arylene ether) copolymer consists of copolymer chains comprising 1 to 15 aromatic ring moieties. Within the intrinsic viscosity range of 0.04 to 0.15 deciliter per gram, the intrinsic viscosity may be at least about 0.06. Also within the intrinsic viscosity range of 0.04 to 0.15 deciliter per gram, the intrinsic viscosity may be up to about 0.12 deciliter per gram, or up to about 0.09 deciliter per gram. Within the range of about 1.8 to about 2 hydroxyl groups per molecule, the number of hydroxyl groups per molecule may be at least about 1.85, or up to about 1.95. Within the range of 1 to 12 units derived from monohydric phenol, the number of units derived from monohydric phenol may be up to about 6, or up to about 4. In one embodiment, the poly(arylene ether) copolymer has an intrinsic viscosity of about 0.04 to about 0.06 deciliter per gram, measured at 25° C. in chloroform, and at least about 10 weight percent of the poly(arylene ether) copolymer consists of copolymer chains comprising 1 to 7 aromatic ring moieties. In one embodiment, the poly(arylene ether) copolymer has an intrinsic viscosity of about 0.06 to about 0.09 deciliter per gram, measured at 25° C. in chloroform, and at least about 10 weight percent of the poly(arylene ether) copolymer consists of copolymer chains comprising 1 to 12 aromatic ring moieties. In one embodiment, the poly(arylene ether) copolymer has an intrinsic viscosity of about 0.09 to about 0.15 deciliter per gram, measured at 25° C. in chloroform; and wherein at least about 10 weight percent of the poly(arylene ether) copolymer consists of copolymer chains comprising 1 to 15 aromatic ring moieties.

The poly(arylene ether) copolymer may be prepared by a method, comprising: oxidatively copolymerizing a monohydric phenol and a dihydric phenol in an aromatic hydrocarbon solvent in the presence of a catalyst comprising a metal ion and a nitrogen-containing ligand to form a solution comprising a polyfunctional poly(arylene ether) having an intrinsic viscosity of about 0.04 to about 0.15 deciliter per gram at 25° C. in chloroform; and contacting the polyfunctional poly (arylene ether) solution with an aqueous solution of a chelating agent to extract the metal ion from the solution; wherein the chelating agent and metal ion are present in a molar ratio of about 1.0 to about 1.5. In the process of research on methods of preparing poly(arylene ether) resins having low intrinsic viscosity and high functionality, the present inventors discovered that conventional methods of extracting catalyst metal ion from a solution of the poly(arylene ether) resulted in the formation of a dispersion that made it difficult to separate the catalyst metal ion from the poly(arylene ether). In particular, when a poly(arylene ether) having an intrinsic viscosity of 0.04 to about 0.3 deciliter per gram and a functionality of at least about 1.5 terminal hydroxyl groups, on average, per chain, was synthesized by metal-catalyzed polymerization of phenolic monomers in an aromatic solvent, and when the resulting solution of poly(arylene ether) was treated with an aqueous solution of a chelating agent to remove the catalyst metal ion, the agitated mixture of the poly(arylene ether) solution and the aqueous chelating agent solution formed a dispersion that did not readily phase separate when agitation was ceased. Thus, the aqueous solution containing the catalyst metal ion and the organic solution containing the poly (arylene ether) could not readily be separated. After extensive research, the present inventors discovered the formation of a dispersion could be avoided by reducing the concentration of chelating agent in the aqueous solution. It was previously thought that such a reduction in the chelating agent concentration would lead to insufficient removal of catalyst metal ion from the poly(arylene ether), but it was surprisingly discovered that the reduced chelating agent concentrations both avoided the dispersion problem and adequately reduced the concentration of catalyst metal ion in the isolated poly (arylene ether) resin. Specifically, using the chelating agent in an amount of about 1.0 to about 1.5 moles per mole of catalyst metal ion avoided dispersion formation while removing all but a few parts per million by weight of catalyst metal from the poly(arylene ether) resin.

The monohydric phenol and the dihydric phenol are described above. Suitable aromatic hydrocarbon solvents include, for example, benzene, toluene, xylenes, and the like, and combinations thereof. In one embodiment, the aromatic hydrocarbon solvent comprises toluene. In addition to the aromatic hydrocarbon solvent, the solvent may, optionally, further comprise a $C_3$-$C_8$ aliphatic alcohol that is a poor solvent for the poly(arylene ether), such as, for example, n-propanol, isopropanol, n-butanol, t-butanol, n-pentanol, and the like, and combinations thereof. A preferred $C_3$-$C_8$ aliphatic alcohol is n-butanol. The solvent may further comprise, in addition to a $C_6$-$C_{18}$ aromatic hydrocarbon and a $C_3$-$C_8$ aliphatic alcohol, methanol or ethanol, which act as an anti-solvent for the poly(arylene ether). The $C_6$-$C_{18}$ aromatic hydrocarbon, the $C_3$-$C_8$ aliphatic alcohol, and the methanol or ethanol may be combined in a wide range of proportions, but it may be preferred that the solvent comprise at least about 50 weight percent of the $C_6$-$C_{18}$ aromatic hydrocarbon.

Although there is no particular limit on the concentrations of the monohydric phenol and the dihydric phenol in the aromatic hydrocarbon solvent, it is preferred to achieve a balance between the increased efficiency of higher monomer concentrations and the easy-to-handle solution viscosities associated with lower monomer concentrations. In one embodiment, the monohydric phenol, the dihydric phenol, and the solvent are used in amounts such that the ratio of the total weight of the monohydric phenol and the dihydric phenol to the total weight of the monohydric phenol, the dihydric phenol, and the solvent is about 0.1:1 to about 0.5:1. Within this range, the ratio may be at least about 0.2:1, or at least about 0.23:1, or at least about 0.26:1. Also within this range, the ratio may be up to about 0.4:1, or up to about 0.37:1, or up to about 0.34:1.

The method comprises oxidatively copolymerizing the monohydric phenol and the dihydric phenol in an aromatic hydrocarbon solvent in the presence of a catalyst comprising a metal ion and a nitrogen-containing ligand. In one embodiment, the catalyst metal ion is selected from ions of copper, manganese, cobalt, iron, and combinations thereof. In one embodiment, the catalyst metal ion comprises copper ion. In one embodiment, the concentration of the catalyst metal ion may be such that the ratio of total moles of monomer (i.e., moles of monohydric phenol plus moles of dihydric phenol) to moles of catalyst metal ion may be about 100:1 to about 10,000:1. Within this range, the ratio may be at least about 300:1, or at least about 600:1. Also within this range, the ratio may be up to about 6,000:1, or up to about 3,000:1.

In addition to the metal ion, the copolymerization catalyst comprises a nitrogen-containing ligand. The nitrogen-containing ligand may include, for example, alkylenediamine ligands, primary monoamines, secondary monoamines, tertiary monoamines, aminoalcohols, oximes, oxines, cyanide, and the like, and combinations thereof.

Suitable alkylenediamine ligands include those having the formula

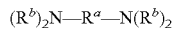

wherein $R^a$ is a substituted or unsubstituted divalent residue wherein two or three aliphatic carbon atoms form the closest link between the two diamine nitrogen atoms; and each $R^b$ is independently hydrogen or $C_1$-$C_8$ alkyl. Preferred alkylenediamine ligands include those in which $R^a$ is dimethylene (—$CH_2CH_2$—) or trimethylene (—$CH_2CH_2CH_2$—), and each $R^b$ is independently hydrogen, isopropyl, or a $C_4$-$C_8$ alpha-tertiary alkyl group. Highly preferred alkylenediamine ligands include N,N'-di-t-butylethylenediamine and N,N,N', N'-tetramethyl-1,3-diaminopropane.

Suitable primary monoamines include $C_3$-$C_{12}$ primary alkylamines, such as, for example, n-propylamine, i-propylamine, n-butylamine, sec-butylamine, t-butylamine, n-penylamine, n-hexylamine, cyclohexylamine, combinations comprising at least one of the foregoing primary monoamines, and the like. A highly preferred primary monoamine is n-butylamine.

Suitable secondary monoamines include secondary monoamines having the structure $(R^c)(R^d)NH$, wherein $R^c$ and $R^d$ are each independently a $C_1$-$C_{11}$ alkyl group, with the proviso that $R^c$ and $R^d$ collectively have a total of four to twelve carbon atoms. Examples of secondary monoamines include di-n-propylamine, n-propyl-n-butylamine, di-n-butylamine, d-t-butylamine, n-butyl-n-penylamine, di-n-hexylamine, and the like, with di-n-butylamine being preferred.

Suitable tertiary monoamines include tertiary monoamines having the structure $(R^e)(R^f)(R^g)N$, wherein $R^e$ and $R^f$ and $R^g$ are each independently a $C_1$-$C_{16}$ alkyl group, with the proviso that $R^e$ and $R^f$ and $R^g$ collectively have a total of four to eighteen carbon atoms. Examples of tertiary monoamines include triethylamine, tri-n-propylamine, tri-n-butylamine, dimethyl-n-butylamine, dimethyl-n-penylamine, diethyl-n-butylamine, tricyclohexylamine, and the like. In addition, cyclic tertiary amines, such as pyridine, alpha-collidine, gamma-picoline, and the like, can be used. Highly preferred tertiary monoamines include dimethyl-n-butylamine. Additional primary, secondary, and tertiary amines are described in U.S. Pat. Nos. 3,306,874 and 3,306,875 to Hay.

Suitable aminoalcohols include $C_4$-$C_{12}$ aminoalcohols having one nitrogen atom and an alcohol oxygen, wherein at least two carbon atoms separate the amino nitrogen and the alcohol oxygen. Examples of aminoalcohols include N,N-diethylethanolamine, 4-butanolamine, N-methyl-4-butanolamine, diethanolamine, triethanolamine, N-phenyl-ethanolamine, and the like, and combinations comprising at least one of the foregoing aminoalcohols. Highly preferred aminoalcohols include triethanolamine and N-phenyl-ethanolamine.

Suitable oximes include benzoin oxime (2-Hydroxy-2-phenylacetophenone oxime), 2-phenyl-2-hydroxybutan-3-one oxime, 2-salicyl-aldoxime, and combinations thereof.

Suitable oxines include those having the formula

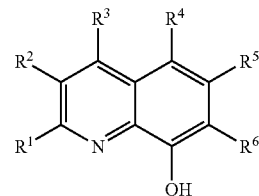

wherein $R^1$-$R^6$ are each independently hydrogen, halogen, hydroxyl, nitro, amino, $C_1$-$C_6$ alkyl, or $C_1$-$C_6$ alkoxyl. Examples of oxines include oxine, 5-methyloxine, 5-hydroxyoxine, 5-nitroxine, 5-aminoxine, 2-methyloxine, and the like, and combinations comprising at least one of the foregoing oxines. Highly preferred oxines include oxine and 5-methyloxine.

The alkylenediamine ligands, primary monoamines, secondary monoamines, aminoalcohols, and oxines, when present, may be used at about 0.01 to about 25 moles per 100 moles of monohydric phenol. The tertiary monoamines may be used at about 0.1 to about 1,500 moles per 100 moles of monohydric phenol.

In addition to the metal ion and the nitrogen-containing ligand, the catalyst may, optionally, further include a halide ion such as chloride, bromide, or iodide. When employed, halide ions may be supplied to the reaction mixture in the form of an alkali metal salt or an alkaline earth metal salt at a concentration of about 0.1 mole to about 150 moles per 100 moles total of phenolic monomer.

In one embodiment, the nitrogen-containing ligand is selected from dibutylamine, dimethylbutylamine, N,N'-di-t-butylethylenediamine, pyridine, and combinations thereof. In one embodiment, the complex metal catalyst comprises copper ion, a secondary alkylenediamine ligand, a secondary monoamine, and a tertiary monoamine. In one embodiment, the complex metal catalyst comprises copper ion, N,N'-di-t-butylethylenediamine, di-n-butylamine, and dimethyl-n-butylamine.

Various modes of addition of the monohydric phenol and the dihydric phenol to the copolymerization mixture are possible. In one embodiment, all of the monohydric phenol and all of the dihydric phenol are added to the reactor before initiating polymerization. In another embodiment, all of the dihydric phenol is added to the reactor before initiating polymerization, and a portion of the monohydric phenol is added to the reaction before initiating polymerization, such that the molar ratio of monohydric phenol to dihydric phenol is about 0.1 to about 30 before initiating polymerization. Within this range, the ratio may be at least about 0.5, or at least about 1. Also within this range, the ratio may be up to about 20, or up to about 10.

In another embodiment, a portion of the monohydric phenol and a portion of the dihydric phenol are added to the reactor before initiating polymerization, and the remainder of the monohydric phenol and the remainder of the dihydric phenol are added to the reactor after initiating polymerization.

In one embodiment, during copolymerization, the reaction temperature may be maintained at about 20 to about 80° C. Within this range, the reaction temperature may be at least about 30° C., or at least about 40° C. Also within this range, the reaction temperature may be up to about 70° C., or up to about 60° C. Different temperatures may be used at different stages of the reaction.

The polymerization reaction time will depend on factors including the identities of the monohydric and dihydric phenol, the solvent, the total monomer concentration, the catalyst type and concentration, and the oxygen concentration. In one embodiment, polymerization reaction times are about 0.5 to about 5 hours.

In one embodiment, during copolymerization, an oxygen flow of about 0.1 to about 3 moles $O_2$ per hour per total moles of monohydric phenol and dihydric phenol may be maintained. Within this range, the oxygen flow may be at least about 0.3 moles $O_2$ per hour per total moles of monohydric phenol and dihydric phenol, or at least about 0.5 moles $O_2$ per hour per total moles of monohydric phenol and dihydric phenol. Also within this range, the oxygen flow may be up to about 2 moles $O_2$ per hour per total moles of monohydric phenol and dihydric phenol, or up to about 1 moles $O_2$ per hour per total moles of monohydric phenol and dihydric phenol.

In one embodiment, the copolymerization catalyst may be present in a concentration such that the catalyst metal ion is present at a concentration of about 0.0001 to about 0.01 moles per total moles of monohydric phenol and dihydric phenol. Within this range, the catalyst metal ion concentration may be at least about 0.0002 moles per total moles of monohydric phenol and dihydric phenol, or at least about 0.0005 moles per total moles of monohydric phenol and dihydric phenol. Also within this range, the catalyst metal ion concentration may be up to about 0.005 moles per total moles of monohydric phenol and dihydric phenol, or up to about 0.002 moles per total moles of monohydric phenol and dihydric phenol. The catalyst amount may also be specified in terms of the weight ratio of total catalyst components to total monomer. Thus, in one embodiment, the ratio of total moles of catalyst metal ion, nitrogen-containing ligand, and halide ion to total moles of monohydric phenol and dihydric phenol is about 0.005 to about 0.5.

The method may be run on any scale, ranging from laboratory scale to commercial production scale. In one embodiment, method may be run on a batch scale corresponding to about 70 to about 80,000 pounds of the polyfunctional poly (arylene ether).

There is no particular limit on the type of chelating agent used, as long is it is effective to sequester the catalyst metal ion at the specified concentration. In one embodiment, the chelating agent is selected from polyalkylenepolyamine polycarboxylic acids, aminopolycarboxylic acids, aminocarboxylic acids, polycarboxylic acids, alkali metal salts of the foregoing acids, alkaline earth metal salts of the foregoing acids, mixed alkali metal-alkaline earth metal salts of the foregoing acids, and combinations thereof. In one embodiment, the chelating agent is selected from nitrilotriacetic acid, ethylenediaminetetraacetic acid, alkali metal salts of the foregoing acids, alkaline earth metal salts of the foregoing acids, mixed alkali metal-alkaline earth metal salts of the foregoing acids, and mixtures thereof. In one embodiment, the chelating agent comprises nitrilotriacetic acid or an alkali metal salt of nitrilotriacetic acid.

The chelating agent and metal ion are present in a molar ratio of about 1.0 to about 1.5. Within this range, the molar ratio may be at least about 1.05, or at least about 1.1, or at least about 1.15. Also within this range, the molar ratio may be up to about 1.4, or up to about 1.3.

In one embodiment, the polyfunctional poly(arylene ether) solution may be contacted with the aqueous solution of a chelating agent is conducted at a temperature of about 30 to about 90° C. Within this range, the temperature may be at least about 50° C., or at least about 60° C., or at least about 65° C., or at least about 70° C. Also within this range, the temperature may be up to about 85° C., or up to about 80° C.

The present inventors have determined that formation of a dispersion during the chelation step may be minimized if the ratio of the polyfunctional poly(arylene ether) solution density to the aqueous solution density is maintained at about 0.6 to about 1.0. Within this range, the ratio may be at least about 0.7, or at least about 0.9. Another way to minimize dispersion formation is to maintain a polyfunctional poly(arylene ether) solution viscosity of about 0.5 to about 3,000 centipoise. Within this range, the viscosity may be at least about 5 centipoise, or at least about 10 centipoise. Also within this range, the viscosity may be up to about 2,000 centipoise, or up to about 500 centipoise. Another way to minimize dispersion formation is to maintain a ratio of the polyfunctional poly (arylene ether) solution viscosity to the aqueous solution viscosity of about 0.5 to about 3,000. Within this range, the ratio may be at least about 5, or at least about 10. Also within this range, the ratio may be up to about 2,000, or up to about 500.

Yet another way to minimize dispersion formation is to mix with the lowest effective energy during the copolymerization and chelation steps. Thus, in one embodiment, oxidatively copolymerizing the monohydric phenol and the dihydric phenol comprises agitating with a mixing energy of about 10 to about 150 kilojoules per kilogram total of the monohydric phenol, the dihydric phenol, the solvent, and the catalyst. Within this range, the mixing energy may be at least about 30 kilojoules per kilogram, or at least 50 kilojoules per kilogram. Also within this range, the mixing energy may be up to about 130 kilojoules per kilogram, or up to 110 kilojoules per kilogram. In another embodiment, contacting the polyfunctional poly(arylene ether) solution with the aqueous chelating agent solution comprises agitating the polyfunctional poly(arylene ether) solution with the aqueous solution with a mixing energy of about 0.5 to about 25 kilojoules per kilogram total of the polyfunctional poly(arylene ether) solution and the aqueous solution. Within this range, the mixing energy may be at least about 1 kilojoule per kilogram, or at least 1.5 kilojoules per kilogram. Also within this range, the mixing energy may be up to about 20 kilojoules per kilogram, or up to about 15 kilojoules per kilogram.

While some agitation in the chelation step is necessary to effectively conduct that step, it is possible to select agitation conditions that minimize dispersion formation. In one embodiment, contacting the polyfunctional poly(arylene ether) solution with the aqueous chelating agent solution comprises agitating the polyfunctional poly(arylene ether) solution with the aqueous solution for about 5 to about 120 minutes. Within this range, the agitation time may be at least about 15 minutes, or at least about 30 minutes. Also within this range, the agitation time may be up about 90 minutes, or up to about 60 minutes.

Chelation and separation can be improved by including a period of agitation-less contact of the polyfunctional poly (arylene ether) solution and the aqueous chelating agent solution. Thus, in one embodiment, contacting the polyfunctional poly(arylene ether) solution with an aqueous solution of a chelating agent comprises agitating the polyfunctional poly (arylene ether) solution with the aqueous solution, and subsequently leaving the polyfunctional poly(arylene ether) solution and the aqueous solution in contact without agitation for about 1 to about 30 hours. Within this range, the period of agitation-less contact may be at least about 4 hours, or at least about 8 hours. Also within this range, the period of agitation-less contact may be up to about 20 hours.

Yet other ways to minimize the chance of dispersion formation during the chelation step include adding solvent to the polyfunctional poly(arylene ether) solution prior to contacting the polyfunctional poly(arylene ether) solution with the chelating agent aqueous solution; adding water to the mixture of the polyfunctional poly(arylene ether) solution and the chelating agent aqueous solution; using a chelating agent concentration of about 0.01 to about 0.1 weight percent based on the total weight of the polyfunctional poly(arylene ether) solution and the aqueous solution of the chelating agent; and using a chelating agent concentration of about 0.5 to about 40 weight percent based on the total weight of the aqueous solution of the chelating agent. In one embodiment, contacting the polyfunctional poly(arylene ether) solution with an aqueous solution of a chelating agent comprises using the chelating agent in an amount of about 0.5 to about 50 weight percent based on the total weight of the aqueous solution of the chelating agent.

There is no particular limit on the method used to isolate the poly(arylene ether) once the chelation step is completed. For example, the poly(arylene ether) solution and the aqueous chelating agent solution may be separated with a liquid-liquid centrifuge. Once this separation has been effected, the polyfunctional poly(arylene ether) may be isolated from the poly (arylene ether) solution using a total isolation method. Suitable total isolation methods include, for example, devolatilizing extrusion, spray drying, wiped film evaporation, flake evaporation, and combinations of the foregoing methods. Devolatilizing extrusion is presently preferred, and the specific techniques of U.S. Pat. No. 6,211,327 B1 to Braat et al. may be employed. The isolated polyfunctional poly (arylene ether) may have an intrinsic viscosity of about 0.04 to about 0.15 deciliter per gram at 25° C. in chloroform. Within this range, the intrinsic viscosity may be at least about 0.06 deciliter per gram. Also within this range, the intrinsic viscosity may be up to about 0.12 deciliter per gram, or up to about 0.09 deciliter per gram.

Even though it utilizes low levels of chelating agent, the method is effective to reduce the concentration of catalyst metal in the isolated polyfunctional poly(arylene ether). Thus, in one embodiment, the isolated polyfunctional poly (arylene ether) has a concentration of catalyst metal of about 2 to about 5 parts per million by weight.

One embodiment is a poly(arylene ether) copolymer prepared by a method, comprising: oxidatively copolymerizing 2,6-dimethyphenol and 2,2-bis(3,5-dimethyl-4-hydroxyphenyl)propane in toluene in the presence of a catalyst comprising copper ion and a nitrogen-containing ligand to form a solution comprising a bifunctional poly(arylene ether) having an intrinsic viscosity of about 0.04 to about 0.15 deciliter per gram at 25° C. in chloroform; and contacting the bifunctional poly(arylene ether) solution with an aqueous solution of nitrilotriacetic acid trisodium salt to extract the copper ion from the solution; wherein the nitrilotriacetic acid trisodium salt and copper ion are present in a molar ratio of about 1.1 to about 1.4; wherein the 2,6-dimethyphenol, the 2,2-bis(3,5-dimethyl-4-hydroxyphenyl)propane, and the toluene are used in amounts such that the ratio of the total weight of the 2,6-dimethyphenol and the 2,2-bis(3,5-dimethyl-4-hydroxyphenyl)propane to the total weight of the 2,6-dimethyphenol, the 2,2-bis(3,5-dimethyl-4-hydroxyphenyl)propane, and the toluene is about 0.26:1 to about 0.34:1; wherein the nitrogen-containing ligand comprises dibutylamine, dimethylbutylamine, and N,N'-di-t-butylethylenediamine; wherein said contacting the bifunctional poly(arylene ether) solution with an aqueous solution of a chelating agent is conducted with agitation at about 50 to about 80° C., for about 15 to about 120 minutes, with a mixing energy of about 5 to about 15 kilojoules per kilogram total of the bifunctional poly(arylene ether) solution and the aqueous solution; wherein said contacting the bifunctional poly(arylene ether) solution with an aqueous solution of nitrilotriacetic acid trisodium salt comprises maintaining a ratio of a bifunctional poly(arylene ether) solution viscosity to an aqueous solution viscosity of about 5 to about 500; and wherein said contacting the bifunctional poly(arylene ether) solution with an aqueous solution of nitrilotriacetic acid trisodium salt comprises maintaining a ratio of a bifunctional poly(arylene ether) solution density to an aqueous solution density of about 0.8 to about 1.0.

The invention is further illustrated by the following non-limiting examples.

EXAMPLES 1-4

Examples 1-4 represent preparations of bifunctional poly (arylene ether)s having intrinsic viscosities of about 0.12, about 0.09, and about 0.06 deciliter per gram These examples also illustrate the effect of copolymerization conditions on the molecular weight distribution of the poly(arylene ether) copolymer. The examples also demonstrate the effect of chelating agent concentration on the separation or emulsification of the combined poly(arylene ether) solution and the aqueous chelating agent solution.

For each example, a monomer solution was prepared using the amounts of 2,6-xylenol (2,6-dimethylphenol), 2,2-bis(3, 5-dimethyl-4-hydroxyphenyl)propane ("tetramethylbisphenol A" or "TMBPA"), and toluene specified in Table 1. The monomer solution was prepared by adding toluene and 2,6-xylenol to a drum, heating to 60° C., and then adding TMBPA and stirring until all the TMBPA had dissolved. After the monomer solution was prepared, the reactor was purged with nitrogen and charged with additional toluene (54.34 kg). The monomer solution was then added to the reactor, followed by catalyst components dibutylamine ("DBA"), dimethylbutylamine ("DMBA"), a previously blended "diamine mix" of N,N'-dibutylethylenediamine ("DBEDA") and didecyl dimethyl ammonium chloride ("PTA") and toluene, and a previously blended mixture of cuprous oxide ("Cu$_2$O") and aqueous hydrogen bromide ("HBr"). At reaction time zero, the oxygen flow rate was initiated and ramped up to 3.40 standard cubic meters per hour (SCMH) in 0.28 SCMH increments, making sure that the headspace oxygen concentration never exceeded 13%. After 65 minutes, the reaction mixture was heated so as to attain a temperature of 49° C. at 80 minutes. After the "end of exotherm time" listed in Table 1, the oxygen flow was decreased to maintain a headspace oxygen concentration below 20%. About 20 to 30 minutes after decreasing the oxygen flow, a sample of the reaction mixture was removed to analyze intrinsic viscosity, percent solids, hydroxyl content, residual 2,6-xylenol, and residual TMBPA. The reaction temperature was increased to 60° C., and the reaction mixture was pumped to a different tank for copper removal and thermal equilibration. A solution having the Table 1 amount of trisodium nitrilotriacetate acid ("Na$_3$NTA") in water was prepared and added with agitation to the reaction mixture, the temperature of which had been increased to 74° C. After two hours, a small sample was removed for visual inspection. The sample from Example 1 had emulsified. Samples from Examples 2-4 initially had clearly separated aqueous and organic layers. (For Example 1, additional portions of Na$_3$NTA solution and toluene were added simultaneously and the mixture was agitated at 74° C. for 15 minutes. For Example 2, additional Na$_3$NTA solution was added and the mixture was agitated at 74° C. for 15 minutes. For Example 4, two additional portions of Na$_3$NTA solution were added, with emulsification occurring after the third addition of Na$_3$NTA solution; addition of more toluene resulted in layer separation.) The mixture was then left at 74° C. for about 12 hours without any agitation. The dense (aqueous) phase was drawn off, and a small sample of the light phase was removed for analysis of copper content. All four examples exhibited copper levels less than 3.5 parts per million. (When the copper content exceeds 5 parts per million by weight, the NTA addition and equilibration step may be repeated with 15 minutes agitation and 2 hours without agitation.) The light (organic, poly(arylene ether)-containing) phase was transferred to a drum. The polymerization conditions are summarized in Table 3.

Polyfunctional poly(arylene ether) solids were isolated by a total isolation procedure that consisted of solvent evaporation on a rotary evaporator and oven drying.

The following properties, presented in Table 4, were determined based on $^1$H NMR data: "Functionality", "Incorporated dibutylamine (wt %)", "Incorporated biphenyl (wt %)", "Internal TMBPA (mol %)", and "Terminal TMBPA (mol %)". "Functionality" is the average number of terminal hydroxyl groups per copolymer chain. For example, a copolymer sample consisting solely of linear copolymer molecules having a terminal hydroxyl group at each end would have a functionality of 2. "Incorporated dibutylamine (wt %)" is the weight percent of dibutylamino-substituted phenylene ether groups incorporated into the copolymer, based on the total weight of copolymer. The dibutylamino-substituted phenylene ether groups have a formula weight based on the structure

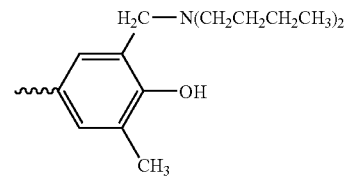

wherein the wavy line represents a bond to the remainder of the copolymer chain. "Incorporated biphenyl (wt %)" is the weight percent of internal groups derived from 3,3',5,5'-tetramethyl-4,4'-biphenol and having the structure

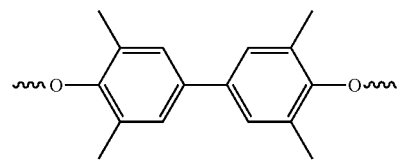

wherein the wavy lines represent bonds to the remainder of the copolymer chain. The weight percent of "incorporated biphenyl" is based on the total weight of copolymer. "Internal TMBPA (mol %)" is the mole percent of TMBPA incorporated as internal (divalent) repeating units into the copolymer, based on the total moles of "internal TMBPA" and "terminal TMBPA". An internal TMBPA unit has the structure

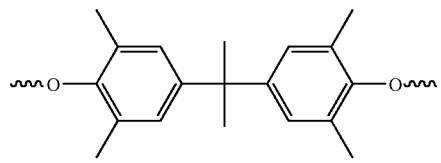

wherein the two wavy lines represent bonds to the remainder of the copolymer chain. "Terminal TMBPA" is the mole percent of TMBPA incorporated as terminal (monovalent) units in the copolymer, based on the total moles of "internal TMBPA" and "terminal TMBPA". A terminal TMBPA unit has the structure

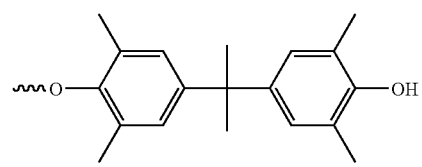

wherein the wavy line represents a bond to the remainder of the copolymer chain.

"Functionality" was determined as follows. $^1$H NMR chemical shift values for terminal and internal units are presented in Table 1. Integrated $^1$H NMR peak areas, normalized for the number of protons generating the peak, were determined for resonances corresponding to the following terminal groups: terminal phenolic residues derived from 2,6-dimethylphenol ("PPE-OH" in Table 1), terminal phenolic residues derived from TMBPA ("TMBPA-OH in Table 1), terminal phenolic resonances corresponding to terminal dibutylamine-substituted phenolic groups derived from 2,6-dimethylphenol and DBA catalyst ("PPE-DBA-OH" in Table 1), and terminal 2,6-dimethylphenyl groups ("PPE tail" in Table 1). Similarly, integrated peak areas, normalized for the number of protons generating the peak, were determined for resonances corresponding to the following internal groups: 2,6-dimethyl-1,4-phenylene ether units derived from 2,6-dimethylphenol ("PPE" in Table 1), divalent groups derived from 3,3',5,5'-tetramethyl-4,4'-biphenol ("Biphenyl" in Table 1), and divalent units derived from TMBPA ("TMBPA" in Table 1). Note that a negligible signal was observed for divalent units corresponding to dibutylamine-substituted phenolic groups derived from 2,6-dimethylphenol and DBA catalyst ("PPE-DBA" in Table 1). Similarly, a negligible signal was observed for monovalent units corresponding to terminal groups derived from 3,3',5,5'-tetramethyl-4,4'-biphenol. The functionality is calculated by taking the sum of normalized peak areas for all terminal phenolic resonances, then dividing by the sum of normalized peak areas for all terminal resonances, then multiplying by 2.

TABLE 1

| Component | | Number Protons | Formula Weight | $^1$H NMR Chemical Shift Integral Region (ppm) |
|---|---|---|---|---|
| Internal | Terminal | | | |
| PPE | | 2 | 120 | 6.63–6.36 |
| TMBPA | | 4 | 282 | 6.98–6.85 |
| Biphenyl | | 4 | 240 | 7.38–7.28 |
| | PPE-OH | 2 | 121 | 6.36–6.24 |
| | PPE-Tail | 3 | 121 | 7.28–6.98 |
| | PPE-DBA-OH | 2 | 248 | 3.40–3.28 |
| | TMBPA-OH | 2 | 283 | 6.84–6.75 |

"Incorporated dibutylamine (wt %)" was calculated as follows. The normalized peak area for each internal and terminal group was multiplied by its formula weight (in atomic mass units) to give a formula-weighted peak area for each group. The "incorporated dibutylamine (wt %)" was calculated by adding the formula-weighted peak areas for the terminal phenolic resonance corresponding to terminal dibutylamine-substituted phenolic groups derived from 2,6-dimethylphenol and DBA catalyst, then dividing by the sum of the formula-weighted peak areas for all internal and terminal groups. In this calculation, the formula-weighted peak area for units containing incorporated dibutylamine is based on a formula weight of 248 atomic mass units for the dibutylamino-substituted phenylene ether group described above.

"Incorporated biphenyl (wt %)" was similarly calculated by dividing the formula-weighted peak area for internal phenolic groups derived from 3,3',5,5'-tetramethyl-4,4'-biphenol by the sum of the formula-weighted peak areas for all internal and terminal groups.

"Internal TMBPA (mol %)" was calculated by dividing the normalized peak area for internal TMBPA units by the sum of the normalized peak areas for internal and terminal TMBPA units. Similarly, "terminal TMBPA (mol %)" was calculated by dividing the normalized peak area for terminal TMBPA units by the sum of the normalized peak areas for internal and terminal TMBPA units.

A detailed analysis of molecular weight distribution was conducted by gel permeation chromatography (GPC). The chromatographic system consists of an Agilent Series 1100 system, including isocratic pump, autosampler, thermostatted column compartment, and multi-wavelength detector. The elution solvent was chloroform with 50 parts per million by weight of di-n-butylamine. Sample solutions were prepared by dissolving 0.01 gram of sample in 20 milliliters chloroform with toluene (0.25 milliliter per liter) as an internal marker. The sample solutions were filtered through a Gelman 0.45 micrometer syringe filter before GPC analysis; no additional sample preparation was performed. The injection volume was 50 microliters and the eluent flow rate was set at 1 milliliter/minute. Two Polymer Laboratories GPC columns (Phenogel 5 micron linear(2), 300×7.80 millimeters) connected in series were used for separation of the sample. The detection wavelength was set at 280 nanometers. The data were acquired and processed using Agilent Chem-Station with integrated GPC data analysis software. The molecular weight distribution results were calibrated with polystyrene standards. The results are reported without any correction as "$M_n$(AMU) by GPC" and "$M_w$(AMU) by GPC" in Table 4.

The copolymer samples were separated into individual copolymer fractions via a gradient elution HPLC method specifically developed for this purpose. The HPLC system was an Agilent Series 1100 system, including vacuum degasser, quaternary pump, autosampler, thermostatted column compartment and a diode array detector. The separating column was a 150 millimeter long by 4.6 millimeter inner diameter Inertsil 50DS-3 column; the detection wavelength was 280 nanometers. The injection volume used was 2 microliters and the sample concentration was 20 milligrams/milliliter in tetrahydrofuran ("THF"). No additional sample preparation was performed. The resolution was improved by a programmed gradual change of the eluent liquid composition as listed in Table 2; between the points listed in Table 2 the eluent composition changed linearly. The individual peaks in the resulting chromatogram were identified based on mass spectral data obtained from the coupling of HPLC and negative ionization atmospheric pressure chemical ionization-mass spectrometry (APC)-MS). For peak quantitation, the integrated areas from components containing an equal number of phenyl groups ("aromatic ring moieties") were summed and their area was calculated relative to the total integrated area. In Table 4, "Cumulative weight percent up to 17 aromatic ring moieties (wt %)" represents the weight percent of the sample containing molecules having 17 or fewer aromatic rings. "Highest no. of aromatic ring moieties in the 10 weight percent of the sample corresponding to the lowest molecular weight" represents the highest number of aromatic ring moieties per chain in the molecular weight fraction corresponding to the 10 weight percent of the sample having the lowest molecular weight.

TABLE 2

| Time (min) | $H_2O$ (%) | MeOH (%) | THF (%) |
|---|---|---|---|
| 0 | 50 | 50 | 0 |
| 2 | 50 | 50 | 0 |
| 32 | 0 | 100 | 0 |
| 132 | 0 | 50 | 50 |
| 150 | 0 | 0 | 100 |
| 160 | 50 | 50 | 0 |
| 165 | 50 | 50 | 0 |

The residual (unreacted) monomer (2,6-xylenol and TMBPA) concentrations in the copolymer resins were determined by gas chromatography with a mass spectrometer detector (GCMS). The Agilent GCMS system used consisted of an autosampler, an Agilent 5890 GC, an electron ionization ion source, and a quadrupole mass analyzer. A GC column (SGC BPX5, 25 millimeter length, 0.22 millimeter internal diameter, 1 micron film thickness) was used to perform the separations. Sample solutions were prepared by dissolving 0.4 gram of sample in 20 milliliters chloroform. Sample solutions were injected into GC under splitless mode. The inlet temperature was set at 280° C. The GC oven temperature was ramped from 45° C. to 310° C. at 10° C./minute and held for 23.5 minutes. Helium was used as carrier gas with 0.9 milliliter/minute flow rate. The mass analyzer was operated under select ion monitoring (SIM) mode for detection. The analytes were detected at 85 atomic mass units (AMU) for decane (used as internal standard), 107 AMU for 2,6-xylenol, and 269 AMU for TMBPA. Under the conditions listed above, the observed retention times for decane, 2,6-xylenol, and TMBPA were 8.68, 10.45, and 24.62 minutes, respectively. The method was calibrated with a series of monomer standard solutions of various concentrations with decane added as internal standard. Residual monomer values are given in Table 4, where they are expressed in parts per million by weight (ppm) based on the total weight of the copolymer.

These examples demonstrate that the present poly(arylene ether) resins have close to two hydroxyl groups per molecule, include a substantial fraction of low molecular weight species, and include a substantial fraction of terminal units derived from the dihydric phenol.

TABLE 3

|  | Ex. 1 | Ex. 2 | Ex. 3 | Ex. 4 |
| --- | --- | --- | --- | --- |
| Monomer solution to prepare and add to reactor: | | | | |
| 2,6-Xylenol | 42.3 kg | 41.7 kg | 38.2 kg | 38.2 kg |
| TMBPA | 5.03 kg | 8.53 kg | 12.07 kg | 12.07 kg |
| Toluene | 50.26 kg | 50.26 kg | 50.26 kg | 50.26 kg |
| Initial toluene to add to reactor | 54.34 kg | 54.34 kg | 54.34 kg | 54.34 kg |
| DBA to add to reactor | 503.8 g | 503.8 | 503.8 | 503.8 |

TABLE 3-continued

|  | Ex. 1 | Ex. 2 | Ex. 3 | Ex. 4 |
| --- | --- | --- | --- | --- |
| DMBA to add to reactor | 1175.6 g | 1175.6 g | 1175.6 g | 1175.6 g |
| Diamine mix to add to reactor (30% DBEDA, 15% PTA, 55% Toluene) | 264.5 g | 264.5 g | 264.5 g | 264.5 g |
| Catalyst to add to reactor: | | | | |
| HBr, 48% solution | 353.3 g | 353.3 g | 353.3 g | 353.3 g |
| $Cu_2O$ | 24.6 g | 24.6 g | 24.6 g | 24.6 g |
| Nitrogen flow | 3.40 SCMH | 4.25 SCMH | 4.25 SCMH | 4.25 SCMH |
| Reactor temperature | 30° C. | 30° C. | 42° C. | 42° C. |
| Reactor agitator speed | 500 rpm | 500 rpm | 500 rpm | 500 rpm |
| End of exotherm time | 160 min | 101 min | 96 min | 96 min |
| % Oxygen in overhead during exotherm | 13% | 13% | 13.5% | 14% |
| % Oxygen in overhead after exotherm | 21% | 20% | 18% | 19% |
| Oxygen flow after exotherm | 0.42 SCMH | 0.42 SCMH | 0.42 SCMH | 0.42 SCMH |
| IV on sample out of the reactor | 0.117 dl/g | 0.075 dl/g | 0.066 dl/g | 0.065 dl/g |
| % solids in reactor | 29.4% | 29.3% | 29.6% | 29.9% |
| First NTA addition (kg of 40% $Na_3NTA$ solution) | 2.05 kg | 0.318 kg | 0.318 kg | 0.318 kg |
| Visual confirmation of heavy phase | Emulsified | Separated | Separated | Separated |
| Copper content | >20 ppm | 3 ppm | — | >20 ppm |
| Second NTA addition (kg of 40% $Na_3NTA$ solution) | 1.8 kg | 0.32 kg | — | 0.32 kg |
| Visual confirmation of heavy phase | — | Separated | — | Separated |
| Copper content | — | 2.9 ppm | — | 7 ppm |
| Third NTA addition (kg of 40% $Na_3NTA$ solution) | — | — | — | 0.32 kg |
| Visual confirmation of heavy phase | — | — | — | Emulsified |
| Copper content | — | — | — | 5.8 ppm |
| Additional toluene added | ~360 kg | — | — | ~450 kg |
| Visual confirmation of heavy phase | Separated | — | — | Separated |
| Total moles NTA/moles Cu | 6.98 | 2.874 | 1.437 | 4.311 |
| Final copper content | 1.1 ppm | 2.9 ppm | 2.8 ppm | 3.5 ppm |

TABLE 4

|  | Ex. 1 | Ex. 2 | Ex. 3 | Ex. 4 |
| --- | --- | --- | --- | --- |
| Final product IV | 0.116 dL/g | 0.087 dL/g | 0.067 dL/g | 0.063 dL/g |
| $M_n$ (AMU) by GPC | 1921 | 1198 | 799 | 774 |
| $M_w$ (AMU) by GPC | 4378 | 2477 | 1690 | 1642 |
| Functionality | 1.90 | 1.91 | 1.92 | 1.91 |
| Incorporated dibutylamine (wt %) | 0.50 | 1.05 | 0.86 | 0.91 |
| Incorporated biphenyl (wt %) | 1.25 | 0.83 | 0.68 | 0.75 |
| Internal TMBPA (mol %) | 74 | 55 | 41 | 41 |
| Terminal TMBPA (mol %) | 26 | 45 | 59 | 59 |
| Unreacted TMBPA (ppm) | 2019 | 8755 | 22702 | 26488 |
| Unreacted 2,6-xylenol (ppm) | 154 | 305 | 537 | 1349 |
| Cumulative weight percent up to 17 aromatic ring moieties (wt %) | 14.3 | 34.5 | 52.9 | 51.7 |
| Highest no. of aromatic ring moieties in the 10 weight percent of the sample corresponding to the lowest molecular weight | 13 | 7 | 5 | 5 |

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

All cited patents, patent applications, and other references are incorporated herein by reference in their entirety.

All ranges disclosed herein are inclusive of the endpoints, and the endpoints are combinable with each other.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another. The modifier "about" used in connection with a quantity is inclusive of the stated value and has the meaning dictated by the context (e.g., it includes the degree of error associated with measurement of the particular quantity).

The invention claimed is:

1. A poly(arylene ether) copolymer,
   wherein the poly(arylene ether) copolymer is the product of oxidative copolymerization of monomers comprising a monohydric phenol and a dihydric phenol;
   wherein the poly(arylene ether) copolymer has an intrinsic viscosity of about 0.04 to about 0.15 deciliter per gram, measured at 25° C. in chloroform;
   wherein the poly(arylene ether) comprises, on average, about 1.8 to about 2 hydroxyl groups per molecule;
   wherein the poly(arylene ether) copolymer comprises about 10 to about 70 mole percent of copolymer chains comprising a terminal unit derived from the dihydric phenol;
   wherein the monohydric phenol comprises 2,6-dimethylphenol; and
   wherein the poly(arylene ether) copolymer comprises about 0.5 to about 1.5 weight percent of units derived from 3,3',5,5'-tetramethyl-4,4'-biphenol.

2. The poly(arylene ether) copolymer of claim 1, wherein the monomers comprise the monohydric phenol and the dihydric phenol in a mole ratio of about 3:1 to about 110:1.

3. The poly(arylene ether) copolymer of claim 1, wherein the monomers comprise the monohydric phenol and the dihydric phenol in a mole ratio of about 5:1 to about 50:1.

4. The poly(arylene ether) copolymer of claim 1, wherein the monohydric phenol further comprises a second monohydric phenol having the structure

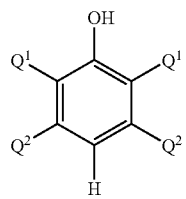

wherein each occurrence of $Q^1$ is independently halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, $C_6$-$C_{12}$ aryl, $C_1$-$C_{12}$ haloalkyl, $C_1$-$C_{12}$ hydrocarbonoxy, or $C_1$-$C_{12}$ halohydrocarbonoxy wherein at least two carbon atoms separate the halogen and oxygen atoms; and wherein each occurrence of $Q^2$ is independently hydrogen, halogen, primary or secondary $C_1$-$C_{12}$ alkyl, $C_2$-$C_{12}$ alkenyl, $C_3$-$C_{12}$ alkenylalkyl, $C_2$-$C_{12}$ alkynyl, $C_3$-$C_{12}$ alkynylalkyl, $C_1$-$C_{12}$ aminoalkyl, $C_1$-$C_{12}$ hydroxyalkyl, $C_6$-$C_{12}$ aryl, $C_1$-$C_{12}$ haloalkyl, $C_1$-$C_{12}$ hydrocarbonoxy, or $C_1$-$C_{12}$ halohydrocarbonoxy wherein at least two carbon atoms separate the halogen and oxygen atoms; provided the second monohydric phenol is not 2,6-dimethylphenol.

5. The poly(arylene ether) copolymer of claim 1, wherein the second monohydric phenol is selected from the group consisting of 2-methylphenol, 2,5-dimethylphenol, 2,3,6-trimethylphenol, and combinations thereof.

6. The poly(arylene ether) copolymer of claim 1, wherein the dihydric phenol has the structure

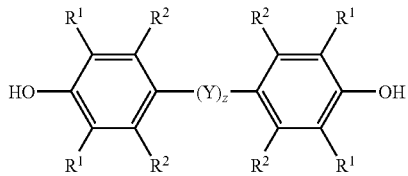

wherein each occurrence of $R^1$ and $R^2$ is independently hydrogen, halogen, primary or secondary $C_1$-$C_{12}$ alkyl, $C_1$-$C_{12}$ alkenyl, $C_1$-$C_{12}$ alkynyl, $C_1$-$C_{12}$ aminoalkyl, $C_1$-$C_{12}$ hydroxyalkyl, $C_6$-$C_{12}$ aryl, $C_1$-$C_{12}$ haloalkyl, $C_1$-$C_{12}$ hydrocarbonoxy, or $C_2$-$C_{12}$ halohydrocarbonoxy wherein at least two carbon atoms separate the halogen and oxygen atoms; z is 0 or 1; and Y is selected from

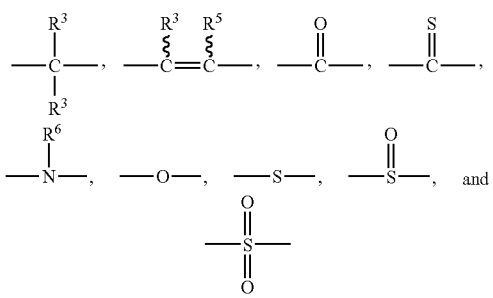

wherein each occurrence of $R^3$-$R^6$ is independently hydrogen or $C_1$-$C_{12}$ hydrocarbyl.

7. The poly(arylene ether) copolymer of claim 1, wherein the dihydric phenol is selected from the group consisting of 1,1-bis(3,5-dimethyl-4-hydroxyphenyl)ethane, 1,1-bis(3-chloro-4-hydroxyphenyl)ethane, 1,1-bis(3-methyl-4-hydroxyphenyl)ethane, 1,2-bis(4-hydroxy-3,5-dimethylphenyl)-1,2-diphenylethane, 1,2-bis(3-methyl-4-hydroxyphenyl)-1,2-diphenylethane, 1,2-bis(3-methyl-4-hydroxyphenyl)ethane, 2,2'-binaphthol, 2,2'-biphenol, 2,2'-dihydroxy-4,4'-dimethoxybenzophenone, 2,2'-dihydroxy-4-methoxybenzophenone, 2,2'-dihydroxybenzophenone, 2,2-bis(3,5-dichloro-4-hydroxyphenyl)propane, 2,2-bis(3-bromo-4-hydroxyphenyl)propane, 2,2-bis(3-phenyl-4- hydroxyphenyl)propane, 2,2-bis(3-methyl-4-hydroxyphenyl)propane, 2,2-bis(3,5-dimethyl-4-hydroxyphenyl) propane, 1,1-bis(3,5-dimethyl-4-hydroxyphenyl)-1-phenylethane, 1,1-bis(3-chloro-4-hydroxyphenyl)-1-phenylethane, 1,1-bis(3-methyl-4-hydroxyphenyl)-1-phenylethane, 2,2-bis(4-hydroxy-3,5-dimethyl phenyl)-1-phenylpropane, 2,2-bis(4-hydroxy-3,5-dimethyl phenyl)hexane, 2,2-bis(4-hydroxy-3,5-dimethylphenyl)pentane, 2,2-bis(3-methyl-4-hydroxynaphthyl)propane, 2,2-bis(3-methyl-4-hydroxyphenyl)-1-phenylpropane, 2,2-bis(3-methyl-4-hydroxyphenyl)hexane, 2,2-bis(3-methyl-4-hydroxyphenyl)pentane, 2,2'-methylenebis(4-methylphenol), 2,2'-methylenebis[4-methyl-6-(1-methylcyclohexyl) phenol], 3,3',5,5'-tetramethyl-4,4'-biphenol, 3,3'-dimethyl-4,4'-biphenol, bis(2-hydroxyphenyl)-methane, bis(4-hydroxy-2,6-dimethyl-3-methoxyphenyl)methane, bis(3,5-dimethyl-4-hydroxyphenyl)methane, bis(3-methyl-4-hydroxyphenyl) methane, bis-(4-hydroxy-3,5-dimethyl phenyl)-cyclohexylmethane, bis(4-hydroxy-3,5-dimethyl phenyl) phenylmethane, bis(3-methyl-4-hydroxyphenyl) cyclohexylmethane, bis(3-methyl-4-hydroxyphenyl) methane, bis(3,5-dimethyl-4-hydroxyphenyl)methane, bis(3-methyl-4-hydroxyphenyl)phenylmethane, 2,2',3,3',5,5'-hexamethyl-4,4'-biphenol, octafluoro-4,4'-biphenol, 2,3,3',5,5'-pentamethyl-4,4'-biphenol, 1,1-bis(3,5-dibromo-4-hydroxyphenyl)cyclohexane 1,1-bis(3,5-dimethyl-4-hydroxyphenyl)cyclohexane, bis(3-methyl-4-hydroxyphenyl)cyclohexane, tetrabromobiphenol, tetrabromobisphenol A, tetrabromobisphenol S, 2,2'-diallyl-4,4'-bisphenol A, 2,2'-diallyl-4,4'-bisphenol S, 3,3',5,5'-tetramethyl-4,4'-bisphenol sulfide, 3,3'-dimethyl bisphenol sulfide, 3,3',5,5'-tetramethyl-4,4'-bisphenol sulfone and combinations thereof.

8. The poly(arylene ether) copolymer of claim 1, wherein the poly(arylene ether) copolymer has an intrinsic viscosity of about 0.04 to about 0.06 deciliter per gram; and wherein the poly(arylene ether) copolymer comprises about 50 to about 70 mole percent of copolymer chains comprising a terminal unit derived from the dihydric phenol.

9. The poly(arylene ether) copolymer of claim 1, wherein the poly(arylene ether) copolymer has an intrinsic viscosity of about 0.06 to about 0.09 deciliter per gram; and wherein the poly(arylene ether) copolymer comprises about 35 to about 55 mole percent of copolymer chains comprising a terminal unit derived from the dihydric phenol.

10. The poly(arylene ether) copolymer of claim 1, wherein the poly(arylene ether) copolymer has an intrinsic viscosity of about 0.09 to about 0.15 deciliter per gram; and
wherein the poly(arylene ether) copolymer comprises about 10 to about 45 mole percent of copolymer chains comprising a terminal unit derived from the dihydric phenol.

11. The poly(arylene ether) copolymer of claim 1, having a weight average molecular weight of about 1,000 to about 6,000 atomic mass units.

12. The poly(arylene ether) copolymer of claim 1, having a number average molecular weight of about 500 to about 2,500 atomic mass units.

13. The poly(arylene ether) copolymer of claim 1, having a ratio of weight average molecular weight to number average molecular weight of about 2:1 to about 3:1.

14. The poly(arylene ether) copolymer of claim 1,
wherein the dihydric phenol comprises 2,2-bis(3,5-dimethyl-4-hydroxyphenyl)propane; and
wherein the poly(arylene ether) copolymer comprises about 150 to about 1350 parts per million by weight of unreacted 2,6-dimethylphenol.

15. The poly(arylene ether) copolymer of claim 1,
wherein the dihydric phenol comprises 2,2-bis(3,5-dimethyl-4-hydroxyphenyl)propane; and
wherein the poly(arylene ether) copolymer comprises about 0.2 to about 2.7 weight percent of unreacted 2,2-bis(3,5-dimethyl-4-hydroxyphenyl)propane.

16. The poly(arylene ether) copolymer of claim 1,
wherein the oxidative copolymerization comprises polymerizing in the presence of a catalyst comprising di-n-butylamine; and
wherein the poly(arylene ether) comprises about 0.2 to about 2 weight percent of incorporated dibutylamine groups.

17. The poly(arylene ether) copolymer of claim 1, comprising 0.50 to 1.05 weight percent of dibutylamino-substituted phenylene ether groups.

* * * * *